United States Patent
Vitiello et al.

(10) Patent No.: US 11,114,340 B2
(45) Date of Patent: Sep. 7, 2021

(54) METHOD FOR PRODUCING AN INTERCONNECTION COMPRISING A VIA EXTENDING THROUGH A SUBSTRATE

(71) Applicant: KOBUS SAS, Montbonnot-Saint-Martin (FR)

(72) Inventors: Julien Vitiello, Grenoble (FR); Fabien Piallat, Montbonnot-Saint-Martin (FR)

(*) Notice: Subject to any disclaimer, the term of this patent is extended or adjusted under 35 U.S.C. 154(b) by 665 days.

(21) Appl. No.: 16/070,506

(22) PCT Filed: Jan. 16, 2017

(86) PCT No.: PCT/EP2017/050761
§ 371 (c)(1),
(2) Date: Jul. 16, 2018

(87) PCT Pub. No.: WO2017/125336
PCT Pub. Date: Jul. 27, 2017

(65) Prior Publication Data
US 2021/0202314 A1     Jul. 1, 2021

(30) Foreign Application Priority Data

Jan. 19, 2016 (FR) .................................. 1650408

(51) Int. Cl.
*H01L 21/44*      (2006.01)
*H01L 21/768*     (2006.01)
(Continued)

(52) U.S. Cl.
CPC ........ *H01L 21/76898* (2013.01); *C23C 16/34* (2013.01); *C23C 16/4405* (2013.01);
(Continued)

(58) Field of Classification Search
CPC ......... H01L 21/76852; H01L 21/76898; H01L 23/481; H01L 23/53238; C23C 16/34;
(Continued)

(56) References Cited

U.S. PATENT DOCUMENTS 5,186,718 A * 2/1993 Tepman ............ H01L 21/67167
29/25.01
2001/0034123 A1* 10/2001 Jeon .................. C23C 16/45527
438/643

(Continued)

*Primary Examiner* — Brook Kebede
(74) *Attorney, Agent, or Firm* — Burr & Forman LLP; Harvey S. Kauget

(57) ABSTRACT

The invention relates to a method for producing an interconnection comprising a via (V) extending through a substrate (1), said method successively comprising: (a) the deposition of a layer (11) of titanium nitride or tantalum nitride on a main surface (1A) of the substrate and on the inner surface (10A, 10B) of at least one hole (10) extending into at least part of the thickness of said substrate; (b) the deposition of a layer (12) of copper on said layer (11) of titanium nitride or tantalum nitride; and (c) the filling of the hole (10) with copper, said method being characterized in that, during step (a), the substrate (1) is arranged in a first deposition chamber (100), and in that said step (a) comprises the injection of a titanium or tantalum precursor in a gaseous phase into the deposition chamber via a first injection path according to a first pulse sequence, and the injection of a nitrogen-containing reactive gas into the deposition chamber via a second injection path different from the first injection path according to a second pulse sequence, the first pulse sequence and the second pulse sequence being dephased.

3 Claims, 3 Drawing Sheets

(51) Int. Cl.
  *H01L 23/48*   (2006.01)
  *H01L 23/532*  (2006.01)
  *C23C 16/44*   (2006.01)
  *C23C 16/34*   (2006.01)
  *C25D 3/38*   (2006.01)
  *C25D 5/02*   (2006.01)
  *C25D 7/12*   (2006.01)
  *C23C 16/455*  (2006.01)

(52) U.S. Cl.
  CPC .......... *C23C 16/45523* (2013.01); *C25D 3/38* (2013.01); *C25D 5/02* (2013.01); *C25D 7/123* (2013.01); *H01L 21/76852* (2013.01); *H01L 23/481* (2013.01); *H01L 23/53238* (2013.01)

(58) Field of Classification Search
  CPC . C23C 16/4405; C23C 16/45523; C25D 3/38; C25D 5/02; C25D 7/123
  USPC ........................................................ 438/667
  See application file for complete search history.

(56) References Cited

U.S. PATENT DOCUMENTS

2005/0006222 A1*  1/2005  Ding .................... C23C 14/3457
                         204/192.1
2011/0057317 A1*  3/2011  Koike ................ H01L 21/28518
                         257/751
2012/0074584 A1*  3/2012  Lee .................... H01L 21/76898
                         257/774

* cited by examiner

METHOD FOR PRODUCING AN INTERCONNECTION COMPRISING A VIA EXTENDING THROUGH A SUBSTRATE

FIELD OF THE INVENTION

The present invention relates to a method for producing an interconnection comprising a via extending through a substrate.

BACKGROUND OF THE INVENTION

Within a substrate, e.g. made of silicon, intended to be electrically connected to electronic components by its two main faces, manufacturing through silicon vias (TSVs) is known for the production of integrated circuits.

Manufacturing such an interconnection typically includes the following:
- forming a hole (generally not a through-hole) in the thickness of the substrate,
- depositing a layer of titanium or tantalum nitride on the main surface of the substrate and on the inner surface of the hole,
- depositing a layer of copper on the titanium nitride layer so as to initiate the next step,
- filling the hole with copper,
- removing a portion of the substrate opposite the main face on which the titanium or tantalum nitride and copper layers have been deposited, until the inside of the hole is exposed, thus turning the via into a through-hole via.

The titanium or tantalum nitride layer serves as a barrier to prevent the copper from being spread into the substrate.

To enable proper electrical conduction through the via, the deposited layers must be compliant and of good quality. A "compliant layer" refers to a layer whose thickness, measured in a direction perpendicular to a surface on which it is deposited, is constant. In other words, the surface of said layer is parallel to the surface on which it is deposited.

Perfect compliance can be obtained by means of a successive deposition of atomic monolayers using the Atomic Layer Deposition (ALD) technique, but this deposition is relatively slow, so that the deposition of a layer of 100 to 200 nm in thickness requires several hours and is therefore particularly expensive.

Physical vapour deposition (PVD) is faster and therefore less expensive, but provides poorer compliance.

Yet, in the case of holes with a high form factor (depth-to-width ratio), i.e. a form factor greater than or equal to 5:1, if not greater than or equal to 10:1, a low compliance of the deposit requires depositing a large thickness of material on the main surface of the substrate to achieve a sufficient thickness in the bottom of the hole. At least part of this excess thickness of material must then be removed from the surface using chemical-mechanical polishing (CMP), which increases the cost and the duration of the step and raises problems of contamination of the polished surface, requiring subsequent cleaning.

Finally, chemical vapour deposition (CVD) provides better compliance than the PVD method, but it has the disadvantage of introducing contaminants (including carbon) that reduce the quality of the layer formed.

Yet, manufacturing vias requires the deposition of layers of good quality, i.e. particularly free of impurities, to minimise the occurrence of copper electromigration, a phenomenon that damages the via over time.

BRIEF DESCRIPTION OF THE INVENTION

One purpose of the invention is to design a method for manufacturing an interconnection comprising a via extending through a substrate that avoids the aforementioned problems and which, more specifically, allows improving the compliance of the deposited layers and avoiding the deposition of an excess thickness of material that must subsequently be removed from the main surface of the substrate. Another purpose of the invention is to also provide interconnections with greater reliability over time.

A method for manufacturing an interconnection comprising a via extending through a substrate is provided in accordance with the invention and including the following successive steps:
- a) depositing a layer of titanium nitride or tantalum nitride on a main surface of the substrate and on the inner surface of at least one hole extending into at least part of the thickness of said substrate;
- b) depositing a layer of copper on said layer of titanium nitride or tantalum nitride;
- c) filling the hole with copper;

said method being characterised in that, during step (a), the substrate is arranged in a first deposition chamber and in that said step (a) comprises the injection of a titanium or tantalum precursor in a gaseous phase into the deposition chamber via a first injection path according to a first pulse sequence and the injection of a nitrogen-containing reactive gas into the deposition chamber via a second injection path different from the first injection path according to a second pulse sequence, the first pulse sequence and the second pulse sequence being out of phase.

Due to its sequential and pulsed implementation, the deposition of the titanium or tantalum nitride layer allows for a faster chemical reaction, but also for better compliance than the conventional CVD method. Moreover, it promotes the reaction on the surface of the substrate and thus limits any contamination of said surface due to interfering reactions.

The term "width" refers to the smallest dimension of the hole in the plane formed by the main surface of the substrate. In the present text, the term "hole" designates an opening of any shape made in a main surface of the substrate and includes, for example, a trench having a length greater than its width or even, but not limited to, a circular orifice (in the latter case, the width corresponds to the diameter of the hole).

According to other advantageous characteristics of said method, taken either separately or in combination:
- the hole filling step (c) is performed by electrodepositing copper;
- filling of the hole is performed by continuing the copper deposition performed in step (b);
- the thickness of the layer of titanium nitride or tantalum nitride deposited in step (a) is less than or equal to 100 nm;
- the thickness of the copper layer deposited in step (b) ranges from 50 to 300 nm;
- the deposition of the copper layer in step (b) is performed in a second deposition chamber that is different from the first chamber;
- step (b) is performed by chemical vapour deposition;
- the first and second deposition chambers are separately connected in a sealed manner to an intermediate chamber and, between steps (a) and (b), the substrate is transferred from the first chamber to the second chamber through the intermediate chamber under a vacuum;
- the via has a form factor greater than or equal to 5:1;
- the method includes, after the hole has been filled, the removal of at least part of the thickness of the substrate opposite the main surface on which the titanium nitride or tantalum nitride layer and the copper layer have been deposited so as to expose the inside of the via in order to turn said via into a through-hole via;

after step (a), the method includes the cleaning of the chamber in which the titanium nitride or tantalum nitride layer has been deposited to remove said titanium nitride or tantalum nitride deposited on an inner wall of said chamber, said cleaning being performed with a fluorine-containing reactive gas and activated by a plasma source;

after step (b), the method includes the cleaning of the chamber in which the copper layer has been deposited to remove said copper deposited on an inner wall of said chamber, said cleaning including the following steps:

(i) copper oxidation;
(ii) injection, according to a pulse sequence, of chemical species suitable for volatilising said oxidised copper, said step (ii) beginning after the start of step (i).

Another purpose relates to a device for implementing the aforementioned method. Said device is characterised in that it includes the following:

a first sealed deposition chamber connected to a source of a titanium or tantalum precursor through a first injection path and to a source of a nitrogen-containing reactive gas through a second injection path that is different from the first path, a second sealed deposition chamber connected to a source of copper and an intermediate chamber to which the first and the second deposition chambers are separately connected in a sealed manner.

BRIEF DESCRIPTION OF THE DRAWINGS

Further characteristics and advantages of the invention will be clear from the detailed description below made in reference to the appended drawings, among which.

For purposes of readability of the figures, they are not necessarily represented to scale.

DETAILED DESCRIPTION OF THE INVENTION

FIGS. 1A to 1E illustrate successive steps in the formation of an interconnection.

Figure 1A:
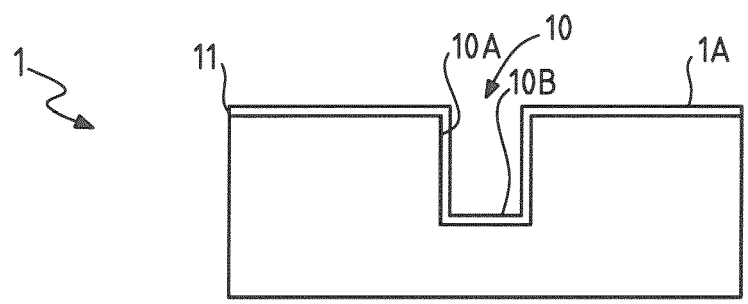
FIGS. 1A to 1E show different steps of the method according to one embodiment of the invention.

With reference to FIG. 1A, a substrate 1 is provided in which at least one hole 10 has been formed starting from a main surface 1A of the substrate. The substrate may be any substrate suitable for producing electronic circuits. The substrate may be solid (i.e. consisting of a single material) or composite (i.e. consisting of a stack of various materials). For example, but not restrictively, the substrate may be a silicon substrate.

Generally, the hole is not a through-hole, i.e. its depth is less than the thickness of the substrate.

Advantageously, the hole has a form factor greater than 5:1, preferably greater than 10:1. However, the invention can be implemented regardless of the form factor of the hole.

A compliant layer 11 of titanium nitride (TiN) or tantalum nitride (TaN) is first deposited on the main surface 1A of the substrate, on the side wall 10A of the hole and on the bottom 10B of the hole.

Said deposit is performed using chemical vapour deposition implemented in a pulsed manner.

More specifically, the substrate is introduced into a first deposition chamber (reference 100 in FIG. 2) comprising two separate injection paths: a first path is used to connect the chamber to a source of a titanium or tantalum precursor and the second path connects the chamber to a source of a nitrogen-containing reactive gas. The term "nitrogen-containing" means that said reactive gas contains mainly nitrogen, but may optionally contain other species, such as hydrogen.

According to an advantageous embodiment, the first injection path comprises a first plurality of channels through which the titanium or tantalum precursor is injected into the deposition chamber and the second injection path comprises a second plurality of channels through which the nitrogen-containing reactive gas is injected into the deposition chamber, all of said channels opening into the deposition chamber facing the surface of the substrate.

In a manner known per se, the substrate is placed in the deposition chamber on a substrate holder optionally comprising a system for heating the substrate to a temperature that is advantageous for the deposition.

The deposition includes the injection of said titanium or tantalum precursor in a gaseous phase into the deposition chamber via the first injection path according to a first pulse sequence and the injection of the nitrogen-containing reactive gas into the deposition chamber via the second injection path, which is different from the first injection path, according to a second pulse sequence, the first pulse sequence and the second pulse sequence being out of phase.

The term "pulse sequence" means at least one pulse per sequence. This method is called pulsed CVD. Such a method has been described in WO 2015/140261 for applications and materials other than those referred to in the present invention.

According to some methods of implementation, as described in WO 2015/140261:

The duration of a pulse in the first pulse sequence ranges from 0.02 s to 5 s

The delay between two pulses in the first pulse sequence ranges from 0.5 s to 10 s The duration of a pulse in the second pulse sequence ranges from 0.02 s to 5 s The delay between two pulses in the second pulse sequence ranges from 0.5 s to 10 s According to other methods of implementation:

The duration of a pulse in the first pulse sequence, respectively in the second pulse sequence, ranges from 0.02 s to 5 s The delay between two pulses in the first pulse sequence, respectively in the second pulse sequence, ranges from 0.02 s to 10 s According to other methods of implementation:

The duration of a pulse in the first pulse sequence, respectively in the second pulse sequence, ranges from 0.02 s to 1 s The delay between two pulses in the first pulse sequence, respectively in the second pulse sequence, ranges from 0.02 s to 1 s According to other methods of implementation:

The duration of a pulse in the first pulse sequence, respectively in the second pulse sequence, ranges from 1 s to 5 s The delay between two pulses in the first pulse sequence, respectively in the second pulse sequence, ranges from 1 s to 10 s The time of travel of the species injected into the chamber is defined by the time required for said species to travel the distance between the outlet of the respective injection path and the free surface of the substrate. The injection of the various species is performed in a suitable sequence so that the reaction between said species essentially takes place on the free surface of the substrate.

Advantageously, the system for heating the substrate holder heats the substrate to a temperature higher than the temperature at which the species are injected into the chamber. As the rate of reaction between species is increasing with temperature, said rate of reaction thus is higher on the free surface of the substrate.

The first pulse sequence and the second pulse sequence are out of phase, i.e. during the deposition process there are successive times during which only the titanium or tantalum precursor is injected into the deposition chamber and times during which only the nitrogen-containing reactive gas is injected into the reaction chamber. Optionally, there may also be times during which a simultaneous injection is performed and/or times during which no injection takes place.

Moreover, the pressure in the deposition chamber is greater than a predetermined value throughout the duration of the process unlike atomic layer deposition (ALD) techniques. In fact, ALD involves the injection of only one type of species at a time and requires the chamber to be completely purged before the other type of species is injected. In the case of the present invention, complex pumping systems and purging steps that slow down the rates at which layers are deposited on the substrates can be omitted. For example, the pressure in the deposition chamber is greater than 500 mTorr, preferably greater than 1 Torr.

The advantage of a rate of deposition of a layer on the surface of a substrate comparable to that of the vapour deposition technique (CVD) can be maintained with this method. Furthermore, the compliance of the layer deposition is greatly improved compared to the conventional vapour deposition technique. In addition, this method promotes a reaction between the tantalum or titanium precursor and the nitrogen-containing reactive gas on the surface of the substrate, thus limiting interfering reactions and a contamination that may deteriorate the properties of the layer formed on the surface of the substrate.

A compliant layer 11 of titanium nitride or tantalum nitride is thus deposited, said layer advantageously having a thickness less than or equal to 100 nm. Said layer fulfils the function of a copper diffusion barrier used to fill the hole toward the substrate.

Figure 1B:
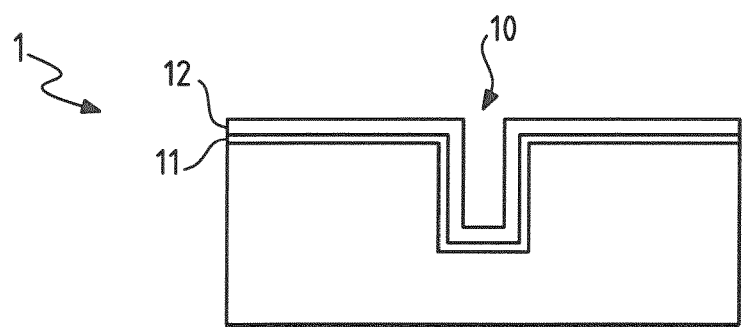

With reference to FIG. 1B, a compliant copper layer 12 is then formed on layer 11, over a thickness generally ranging from 50 to 300 nm.

For this purpose, the substrate 1 covered with the layer 11 is advantageously moved to a second deposition chamber (reference 200 in FIG. 2) that is separate and isolated from the first chamber. Preferably, said move is performed without venting the substrate, which avoids any contamination or oxidation. In fact, contamination or oxidation of the deposited layers is likely to reduce the adherence of said layers and to promote copper electromigration during operation of a device comprising the via.

The deposition of the layer 12 can be performed using any appropriate technique. Advantageously, said deposition is performed using, pulsed or non-pulsed, chemical vapour deposition.

Figure 1C:
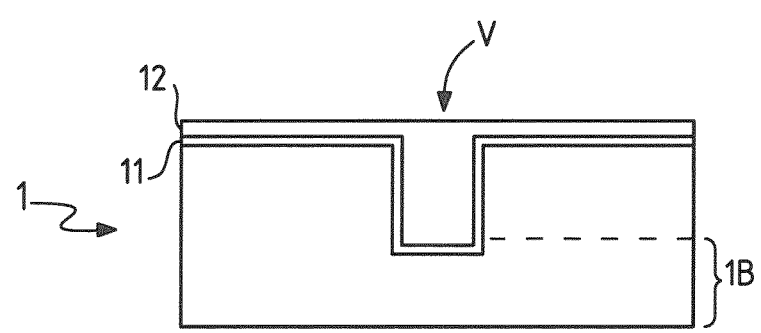

With reference to FIG. 1C, the hole 10 is filled with copper. In the case where the hole has a width less than 1 μm, said filling can be performed by continuing the copper deposition performed in the previous step. Alternatively, and especially in the case where the hole has a width greater than 1 μm, filling of the hole can be achieved through electrodeposition, this technique being faster and less expensive than chemical vapour deposition.

Figure 1D:
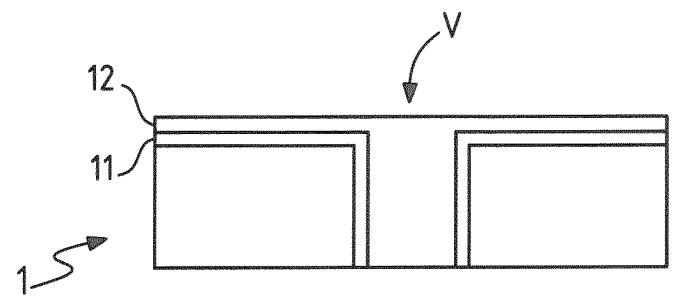

With reference to FIG. 1D, the via V thus formed is turned into a through-hole via by removing at least a portion 1B of the thickness of the substrate opposite the main surface 1A. The removal can be achieved, for example, through polishing, more specifically through chemical-mechanical polishing (CMP).

Figure 1E:
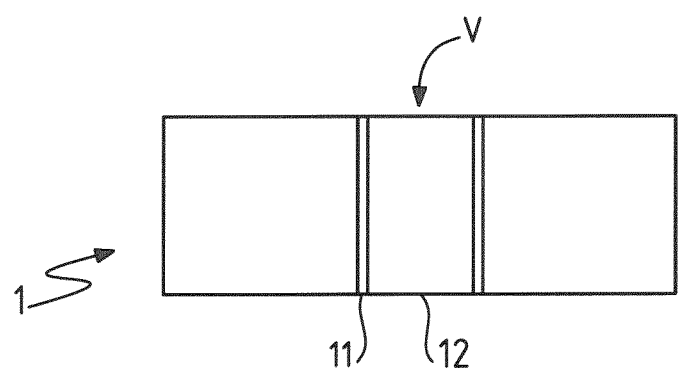

With reference to FIG. 1E, at least part of the tantalum or titanium nitride and copper layers are removed from the main surface 1A of the substrate through chemical-mechanical polishing.

The steps illustrated in FIGS. 1D and 1E can optionally be inverted.

According to one embodiment of the invention, the chamber 100 and/or the chamber 200 can be cleaned after the deposition step, once the substrate has been removed from the chamber.

With regard to the first deposition chamber 100, said cleaning is advantageously performed by injecting a fluorine-containing reactive gas into the chamber and by activating said gas with a plasma source located in situ or at a distance from the chamber.

With regard to the second deposition chamber 200, said cleaning comprises the following steps:
(i) copper oxidation;
(ii) injection, according to a pulse sequence, of chemical species suitable for volatilising said oxidised copper, said step (ii) beginning after the start of step (i) and taking place either after the end of step (i) or during part of step (i). In other words, the first pulse of step (ii) is performed after the start of step (i), whether said step is completed or not. Step (i) can be performed by injecting oxidising species including at least one of the following species: oxygen, ozone, nitrous oxide. Said oxidising species can be injected continuously throughout the entire duration of the cleaning method.

In the case of copper, the chemical species used to volatilise the oxidised copper include hfacH (hexafluoroacetylacetone). However, said chemical species suitable for volatilising the oxidised metal deposit could also react with the copper deposit and thus passivate the exposed surface of said deposit. The reaction passivating the metal deposit 2 is an interfering reaction, which limits or blocks any reaction in which the oxidising species oxidise said deposit. In order to avoid this interfering reaction, the chemical species suitable for volatilising the oxidised copper deposit are injected, in step (ii), according to a pulse sequence. The chamber 200 can be maintained at a temperature ranging from 20 to 250° C. so as to maintain the chemical species suitable for volatilising the copper deposit in gaseous form. Preferably, the temperature of the chamber 200 is maintained at a temperature between 20 and 150° C., more preferably between 20 and 100° C. The pressure in the chamber 200 is maintained between 0.1 and 10 Torr or, preferably, between 1 and 5 Torr.

According to some methods of implementation:
the duration of the pulse(s) for injecting chemical species suitable for volatilising the oxidised metal deposit ranges from 0.02 s to 5 s and the delay between two consecutive pulses (if any) ranges from 0.02 s to 10 s;
the duration of the pulse(s) for injecting chemical species suitable for volatilising the oxidised metal deposit ranges from 0.02 s to 1 s and the delay between two consecutive pulses (if any) ranges from 0.02 s to 1 s; the duration of the pulse(s) for injecting chemical species suitable for volatilising the oxidised metal deposit ranges from 1 s to 5 s, and the delay between two consecutive pulses (if any) ranges from 1 s to 10 s.

Advantageously, the duration of the pulses of the pulse sequence is adjusted so that the layer of the oxidised copper is not completely volatilised. The part of the oxidised copper layer that remains thus forms a barrier against the passivation of the metal deposit by the chemical species injected in step (ii). The passivation reaction is therefore blocked. In other words, during the injection of the chemical species for volatilising the oxidised metal deposit, during the latter of the two successive pulses, the chemical species are injected in a substoichiometric quantity with respect to the quantity of metal deposit oxidised between said two successive pulses. The aforementioned substoichiometric quantity can be determined when both the quantity of copper deposit oxidised in step (i) between two pulses of the pulse sequence in step (ii) and the mechanism of the volatilisation reaction of said copper deposit oxidised with the chemical species are known.

The mode of injection of the chemical species suitable for volatilising the oxidised copper deposit thus has many advantages. The first advantage is to provide an effective cleaning method. In fact, the interfering reaction, which includes the passivation of the copper deposit by the injected chemical species, is thus neutralised. The neutralisation of said interfering reaction avoids having to open the chamber 200 and to use a process for decontaminating the latter. The second advantage is to be able to control the quantity of chemical species injected in step (ii) and thus allows reducing the cost of the cleaning method.

Cleaning allows for the risk of depositing particles on the surface of the substrate 1 to be minimised and thus for the quality of the deposited layers to be improved. This also increases the number of plates that can be deposited before the chamber is cleaned in a chemical bath.

It follows from the various measures described above that the titanium or tantalum nitride and copper layers are not only formed with proper compliance in less time (typically of the order of 2 minutes for a 40 nm layer), but also that they are of better quality, which minimises the risk of subsequent copper electromigration. The interconnection thus is more reliable and this for a longer period of time than existing interconnections.

We will now describe an example of a device for forming a via according to the method described above.

Figure 2:
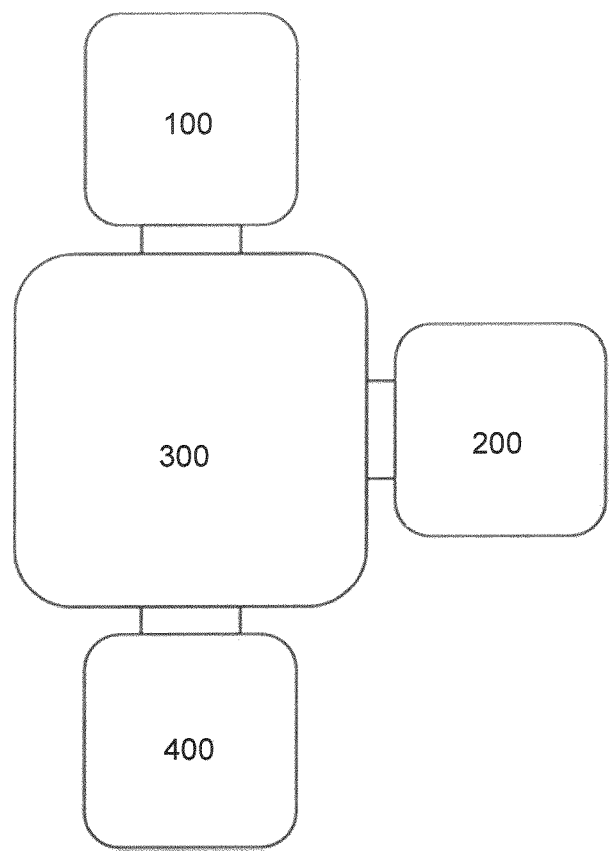
FIG. 2 is a block diagram of a device for implementing the method.

With reference to FIG. 2, said device comprises a first sealed deposition chamber 100 that can be placed under a vacuum, connected by a first injection path to a source of a titanium or tantalum precursor (not shown) and by a second injection path to a source of a nitrogen-containing reactive gas (not shown), as well as a second sealed deposition chamber 200 connected to a copper source (not shown).

The device further comprises an inlet/outlet airlock 400 through which the substrates on which the tantalum or titanium nitride and copper layers to be formed are introduced and through which the substrates on which said layers are formed are removed.

Said inlet/outlet airlock 400 opens into a sealed intermediate chamber 300, which can connect separately with the first deposition chamber 100 and with the second deposition chamber 200. A substrate handling and transport system (not shown) is arranged inside the device to allow for the substrate to be moved from one chamber to another.

The atmosphere in the chamber 300 is controlled so as to avoid contamination of a substrate moving between the various chambers.

Thus, during the formation of the tantalum or titanium nitride layer, the substrate moves between the intermediate chamber 300, the deposition chamber 100 and the deposition chamber 200, said chambers being fluidly isolated from each other during the implementation of the method's steps. Any mutual contamination of the rooms that may generate difficult-to-clean deposits on the inner walls of the rooms is thus avoided.

The invention claimed is:

1. A method for producing an interconnection comprising a via extending through a substrate, said method comprising the following successive steps;
depositing a layer of titanium nitride or tantalum nitride on a main surface of the substrate and on the inner surface of the at least one hole extending into at least part of the thickness of substrate;
depositing a layer of copper on said layer of titanium nitride or tantalum nitride;
filling the hole with copper;
said method being characterized in that, during step (a), the substrate is arranged in a first deposition chamber, and in that said step (a) comprises the injection of a titanium or tantalum precursor in a gaseous phase into the deposition chamber via a first injection path according to a first pulse sequence and the injection of a nitrogen-containing reactive gas into the deposition chamber via a second injection path different from the first injection path according to a second pulse sequence, the first pulse sequence and the second pulse sequence being out of phase, the pressure in the first deposition chamber being grater than 500 mTorr during the entire duration of step a), wherein the duration of a pulse in the first pulse sequence, respectively in the second pulse sequence, ranges from 0.02 s to 5 s; and the delay between two pulses in the first pulse sequence, respectively in the second pulse sequence, ranges from 0.02 s to 10 s, or from 0.5 s to 10 s.

2. A method for producing an interconnection comprising a via extending through a substrate, said method comprising the following successive steps;
depositing a layer of titanium nitride or tantalum nitride on a main surface of the substrate and on the inner surface of at least one hole extending into at least part of the thickness of said substrate;
depositing a layer of copper on said layer of titanium nitride or tantalum nitride;
filling the hole with copper;
said method being characterized in that, during step (a), the substrate is arranged in a first deposition chamber, and in that said step (a) comprises the injunction of a titanium or tantalum precursor in a gaseous phase into the deposition chamber via a first injection path according to a first pulse sequence and the injection of a nitrogen-containing reactive gas into the deposition chamber via a second injection path different from the first injection path according to a second pulse sequence, the first pulse sequence and the second pulse sequence being out of phase, the pressure in the first deposition chamber being greater than 500 mTorr during the entire duration of step a), after step (a), it includes cleaning the chamber in which the titanium nitride or tantalum nitride layer has been deposited to remove said titanium nitride or tantalum nitride deposited on an inner wall of said chamber, said cleaning being performed with a fluorine-containing reactive gas and activated by a plasma source.

3. A method for producing an interconnection comprising a via extending through a substrate, said method comprising the following successive steps;

depositing a layer of titanium nitride or tantalum nitride on a main surface of the substrate and on the inner surface of at least one hole extending into at least part of the thickness of said substrate;

depositing a layer of copper on said layer of titanium nitride or tantalum nitride;

filling the hole with copper;

said method being characterized in that, during step (a), the substrate is arranged in a first deposition chamber, and in that said step (a) comprises the injection of a titanium or tantalum precursor in a gaseous phase into the deposition chamber via a first injection path according to a first pulse sequence and the injection of a nitrogen-containing reactive gas into the deposition chamber via a second injection path different from the first injection path according to a second pulse sequence, the first pulse sequence and the second pulse sequence being out of phase, the pressure in the first deposition chamber being greater than 500 mTorr during the entire duration of step a), wherein after step (b), it includes cleaning the chamber in which the copper layer has been deposited to remove said copper deposited on an inner wall of said chamber, said cleaning including the following steps:

copper oxidation;

injection, according to a pulse sequence, of chemical species suitable for volatilizing said oxidized copper, said step (ii) beginning after the start of step (i).

\* \* \* \* \*

UNITED STATES PATENT AND TRADEMARK OFFICE
CERTIFICATE OF CORRECTION

Page 1 of 1

PATENT NO. : 11,114,340 B2
APPLICATION NO. : 16/070506
DATED : September 7, 2021
INVENTOR(S) : Julien Vitiello and Fabien Piallat It is certified that error appears in the above-identified patent and that said Letters Patent is hereby corrected as shown below:

In the Claims

Column 8, Line 19 delete the word "the"
Column 8, Line 20 "substrate" should be "said substrate"
Column 8, Line 34 "grater" should be "greater"
Column 8, Line 53 "injunction" should be "injection"
Column 8, Line 62 "after" should be "wherein after"

Signed and Sealed this
Seventh Day of December, 2021

Drew Hirshfeld
*Performing the Functions and Duties of the
Under Secretary of Commerce for Intellectual Property and
Director of the United States Patent and Trademark Office*